United States Patent
Chong et al.

(10) Patent No.: US 8,922,264 B1
(45) Date of Patent: Dec. 30, 2014

(54) METHODS AND APPARATUS FOR CLOCK TREE PHASE ALIGNMENT

(71) Applicant: Altera Corporation, San Jose, CA (US)

(72) Inventors: Yan Chong, San Jose, CA (US); Warren Nordyke, Cupertino, CA (US); Sean Shau-Tu Lu, San Jose, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/871,812

(22) Filed: Apr. 26, 2013

(51) Int. Cl.
*G06F 1/04* (2006.01)
*H03L 7/00* (2006.01)

(52) U.S. Cl.
CPC ........................... *H03L 7/00* (2013.01)
USPC ............ 327/291; 327/293; 327/213; 327/236; 375/329

(58) Field of Classification Search
CPC .... H04L 7/0331; H04L 7/0332; H04L 7/0038
USPC ......... 327/231, 235, 236, 355, 356, 361, 291, 327/293, 298; 375/329, 332, 334–335
See application file for complete search history.

(56) References Cited

U.S. PATENT DOCUMENTS

| | | | |
|---|---|---|---|
| 6,586,977 B2 * | 7/2003 | Yang et al. | 327/157 |
| 7,336,754 B2 * | 2/2008 | Aoyama | 375/376 |
| 7,498,889 B2 * | 3/2009 | Altmann | 331/17 |
| 8,265,201 B1 | 9/2012 | Wang et al. | |
| 8,373,472 B2 | 2/2013 | Thaller et al. | |
| 2012/0269304 A1 | 10/2012 | Ciacci et al. | |

FOREIGN PATENT DOCUMENTS

| | | |
|---|---|---|
| EP | 1385294 | 1/2004 |
| EP | 1963943 | 4/2012 |

* cited by examiner

*Primary Examiner* — An Luu (57) ABSTRACT

Clock alignment circuitry may include phase comparator circuitry with a first input terminal that receives as first clock signal from a first clock tree and a second input terminal that receives a second clock signal from a second clock tree. The phase comparator circuitry may compare the first and second clock signals and generate different control signals based on the first and second clock signals. The integrated circuit may further include phase interpolator circuitry that generates an output clock signal based on at least one of the control signals received from the phase comparator circuitry. Edges of the generated output clock signal may align with edges of either the first clock signal or the second clock signal.

19 Claims, 7 Drawing Sheets

| SMP1 | SMP2 | IN-DWN | IN-UP |
|------|------|--------|-------|
| 0 | 0 | 1 | 0 |
| 1 | X | 0 | 1 |
| 0 | 1 | 0 | 0 |

METHODS AND APPARATUS FOR CLOCK TREE PHASE ALIGNMENT

BACKGROUND

Integrated circuit devices typically include logic or circuit blocks that are used to implement a variety of functions. When used in a larger system, an integrated circuit device may also be coupled to other circuit elements within the system. Data may be communicated between the different devices and circuits through various protocols. For instance, an integrated circuit device such as a field programmable gate array (FPGA) may communicate with external memory modules through different memory interfaces.

In an exemplary system, when communicating with an external element such as a memory module, data signals from the external element may be transmitted to the integrated circuit device through input-output circuitry on the integrated circuit device. The data signals may then be transmitted from the input-output circuitry (normally located on the peripheral region of the device) to other logic blocks within the integrated circuit device for further processing.

When signals need to be transmitted to different circuit blocks within an integrated circuit device, the integrated circuit device typically includes a clock distribution network (which may be formed by different clock tree structures within the device) to ensure proper synchronization between the different circuit or logic blocks.

As data signals are transmitted to different parts of the integrated circuit device, clock signals may also be transmitted through a clock distribution network within the integrated circuit device to the different logic or circuit blocks. In a synchronous design, this ensures that valid data signals are captured at every circuit block (e.g., flip-flops, latches, etc.) that forms part of the design. However, if the different clock tree structures have different path lengths, the clock signals may not arrive at all the circuit blocks at the same time.

For example, the clock signals may be routed through a shorter clock path to a circuit block that is located closer to the clock source compared to a circuit block that is located farther away from the clock source. As such, clock skew or misalignment may occur if the clock signals received by different logic blocks arrive at different times due to differing path characteristics such as different path lengths.

SUMMARY

Circuitry and techniques for aligning clock signals in an integrated circuit are provided. Embodiments of the present invention include circuits and techniques to align clock phases among different clock signals. In one embodiment, the phase alignment may be maintained across voltage and temperature variations.

It is appreciated that the present invention can be implemented in numerous ways, such as a process, an apparatus, a system, or a device. Several inventive embodiments of the present invention are described below.

Clock alignment circuitry may include phase comparator circuitry and phase interpolator circuitry. The phase comparator circuitry may receive a first clock signal at a first input terminal and may receive a second clock signal at a second input terminal. The phase comparator circuitry compares the first and second clock signals to output corresponding first and second control signals. The phase interpolator circuitry generates an output clock signal based on at least one of the first and second control signals. Phases of the generated output clock signal may be aligned with phases of either the first clock signal or the second clock signal.

A method of aligning clock signals in an integrated circuit may include comparing a first feedback clock signal received from a first clock tree with a second feedback clock signal received from a second clock with phase comparator circuitry. First and second control signals may then be generated with the phase comparator circuitry in response to the comparison of the first and second feedback clock signals. An output clock signal may be generated by interpolating between a plurality of phases of a third clock signal based on at least one of the first and second control signal generated by the phase comparator circuitry.

DETAILED DESCRIPTION

The embodiments provided herein include circuitry and techniques to align clock signals, or phases of different clock signals, in an integrated circuit (IC).

It will be obvious, to one skilled in the art, that the present exemplary embodiments may be practiced without some or all of these specific details. In other instances, well-known operations have not been described in detail in order not to unnecessarily obscure the present embodiments.

Figure 1:
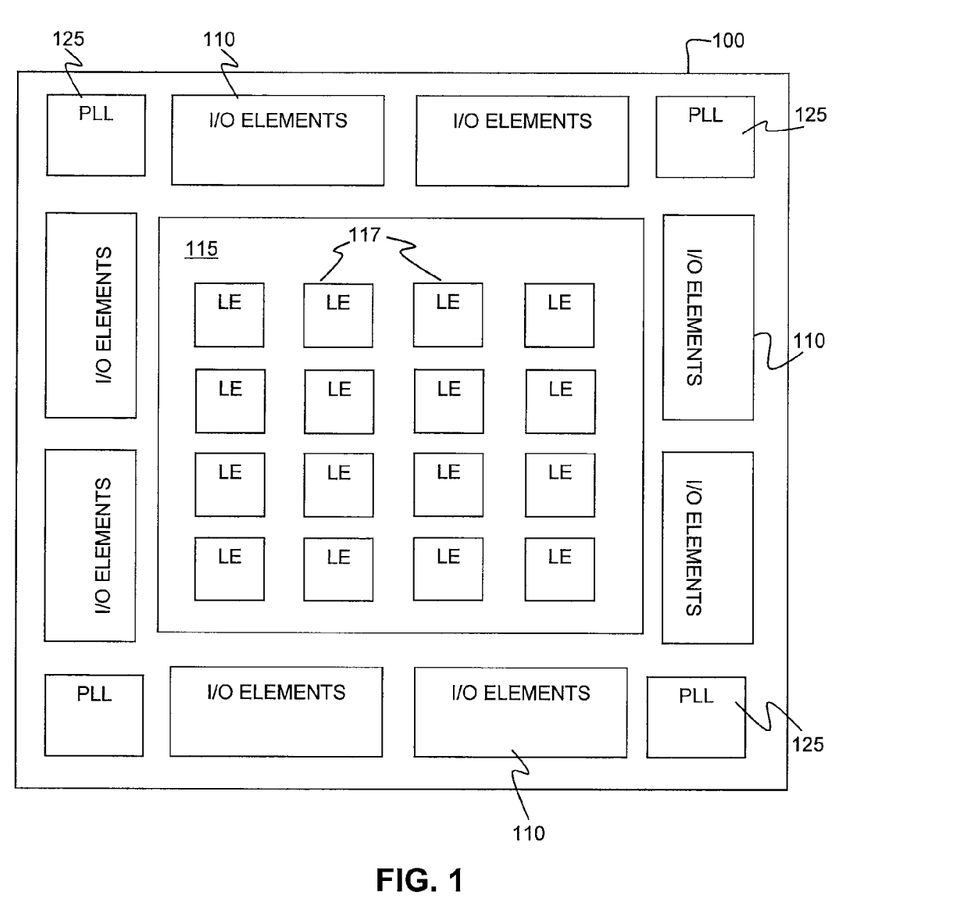
FIG. 1 is a simplified block diagram of an integrated circuit in accordance with one embodiment of the present invention.

FIG. 1, meant to be illustrative and not limiting, shows a simplified block diagram of an integrated circuit device 100 that can be used to implement embodiments of the present invention. As shown in FIG. 1, device 100 may include core logic region 115 and input-output elements 110. Core logic region 115 may be populated with logic cells that include "logic elements" (LEs) 117, among other circuits. As an example, LEs 117 may include look-up table-based logic regions and may be grouped into "Logic Array Blocks" (LABs). Accordingly, LEs 117 and groups of LEs or LABs can be configured to perform logical functions desired by the user. Alternatively, core logic region 115 may contain application specific integrated circuit (ASIC) standard cells or custom cells to perform logic operations.

Other auxiliary circuits, such as phase-locked loops (PLLs) 125 for clock generation and timing, may be located outside the core logic region 115 (e.g., at corners of IC 100 and adjacent to input-output elements 110). As mentioned above, clock signals may need to be routed to different parts of the IC to synchronize various logic blocks in a given design. Accordingly, in one embodiment, a PLL circuit (e.g., PLLs 125) may be used to generate the required clock signals. The clock signals may then be transmitted to other logic blocks within the IC (e.g., LEs 117 in core logic region 115) through a clock distribution network (not shown in the embodiment of FIG. 1).

In the embodiment of FIG. 1, input-output elements 110 may include input-output buffers that connect IC 100 to other external components. A single device like IC 100 can potentially support a variety of different interfaces and each individual input-output bank 110 can support a different input-output standard with a different interface or protocol (e.g., double data rate protocol, high-speed serial interface protocol, etc.).

Signals received from external components at input-output elements 110 may be routed from input-output elements 110 to core logic region 115 or other logic blocks on IC 100. Core logic region 115 and other logic blocks on IC 100 may then perform functions based on the signals received. Accordingly, signals may also be transmitted from core logic region 115 and other relevant logic blocks of IC 100 to other external circuitry or components that may be connected to IC 100 through input-output elements 110. In a synchronous design, clock signals may be transmitted through different clock trees (not shown) within IC 100 to input-output elements 110 and core logic region 115 (more specifically to different logic blocks, or LEs 117, within core logic region 115).

Figure 2:
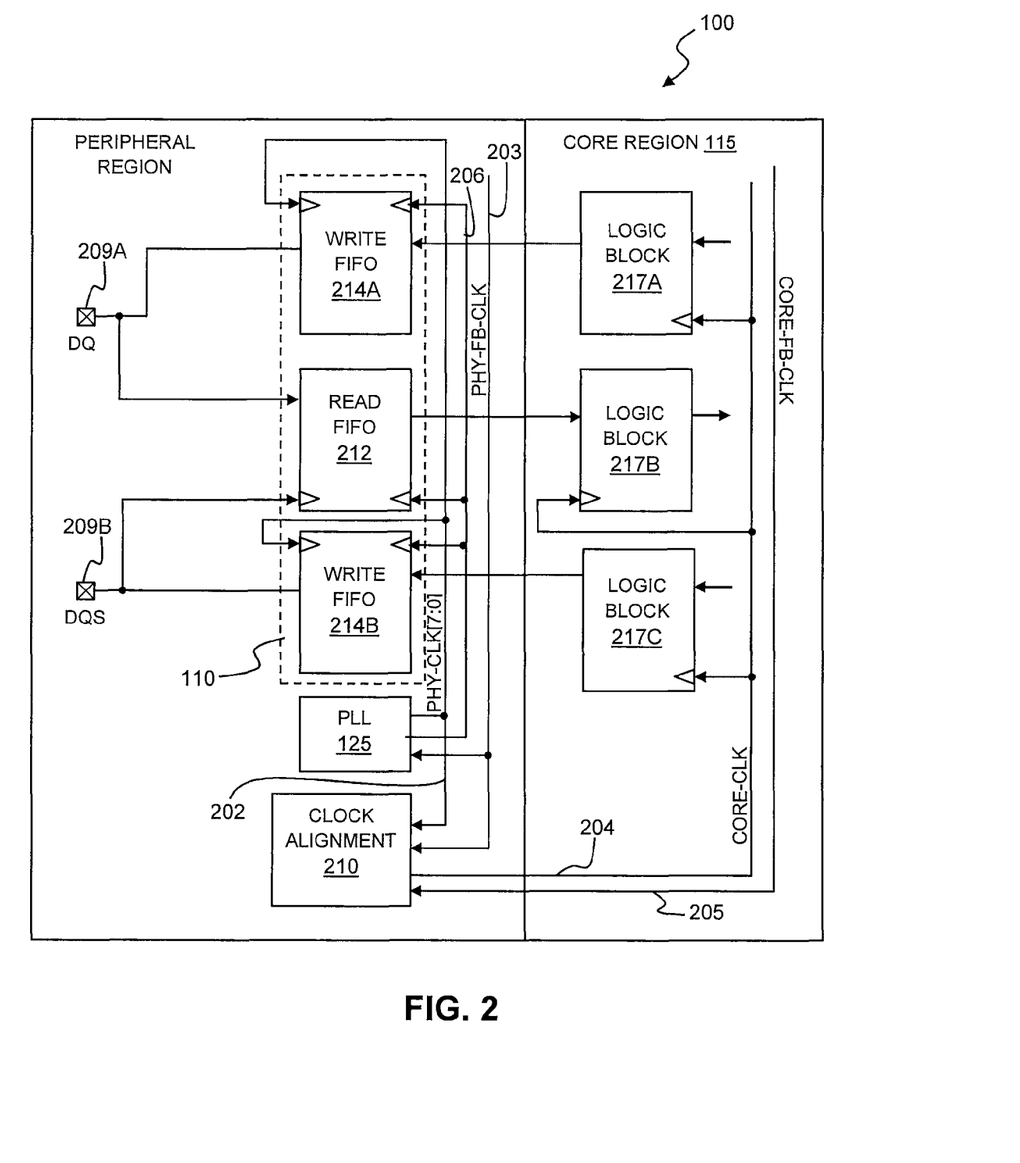
FIG. 2 shows illustrative clock trees that may be used to transmit clock signals to different regions of the integrated circuit in accordance with one embodiment of the present invention.

FIG. 2 shows illustrative PHY-CLK[7:0] clock tree 202 and CORE-CLK clock tree 204 that may be used to transmit clock signals to different regions of IC 100 in accordance with one embodiment of the present invention. As mentioned above, IC 100 may be coupled to external circuitry through input-output elements 110. As an example, IC 100 may be coupled to a random access memory (RAM) module and may communicate with the RAM module through a double data rate (DDR) interface. The embodiment of FIG. 2 shows input-output 110 of IC 100 with read and write registers (e.g., first-in-first-out registers 212 and 214A-214B) that may be coupled to a memory module (not shown) through the DDR interface.

Generally, a memory module that uses the DDR interface may transfer two data words per clock cycle. A clock signal may also be transferred for synchronization. Accordingly, in one embodiment, input-output port 209A may receive data (DQ) signals from an external memory module, whereas input-output port 209B may be a data-strobe (DQS) port that receives a clock signal from the memory module (or any other external elements that may be coupled to IC 100).

When reading from the memory module, data signals received at DQ port 209A may be transmitted to read FIFO 212 and corresponding clock signals received at DQS port 209B may be transmitted to a clock terminal of read FIFO 212. Read FIFO 212 may transmit the received data signals to core region 115 of IC 110, or more specifically, to logic blocks within core region 115 (e.g., logic block 217B).

Accordingly, when writing to the memory module, data signals may be transmitted from logic blocks within core region 115 (e.g., logic blocks 217A and 217C) to the respective write FIFOs 214A and 214B. The data signals may then be transmitted from write FIFOs 214A and 214B to the external memory module through the respective input-output ports (e.g., DQ port 209A and DQS port 209B).

In the embodiment of FIG. 2, read FIFO 212 may receive serial data from the memory module and write FIFOs 214A-214B may transmit serial data from IC 100 to the memory module. As such, read FIFO 212 may act as a deserializer that converts the serial data it receives to parallel data before transmitting the data to core region 115. Conversely, write FIFOs 214A-214B may act as serializers that convert parallel data that they receive from core region 115 to serial data before transmitting the data to the memory module. Therefore, depending on whether IC 100 is reading from or writing to the memory module, read FIFO 212 and write FIFOs 214A-214B may be controlled by different clock signals that are generated by a clock generation circuit (e.g., PLL 125) on IC 100. As an example, write FIFOs 214A-214B may be clocked by a slower clock signal (e.g., a half-rate or a quarter-rate PHY-CLK[7:0] signal) from clock tree 206 when receiving parallel data from core region 115. Accordingly, write FIFOs 214A-214B may be clocked with a selected phase of the PHY-CLK[7:0] signal when transmitting serial data to the external memory module.

In the embodiment of FIG. 2, PLL 125 may generate different clock signals (e.g., clock signals with different phases or frequencies) that may then be transmitted to the respective circuit blocks on IC 100 through different clock trees (e.g., clock trees 202-206) within IC 100. As shown in FIG. 2, PHY-CLK[7:0] may be an eight-phase clock signal generated by PLL 125. As an example, write FIFOs 214A and 214B may receive a physical layer clock signal from a corresponding clock tree (e.g., a selected phase of the eight-phase PHY-CLK[7:0] signal from PHY-CLK[7:0] clock tree 202) while logic blocks 217A-217C in core region 115 may receive a core region clock signal from another corresponding clock tree (e.g., CORE-CLK signal from CORE-CLK clock tree 204).

As different clock trees may have different path lengths depending on where the clock source (e.g., PLL 125) is located, the clock signals received at different logic blocks within the IC may not be aligned with one another. As shown in FIG. 2, PLL 125 is located at the peripheral region of IC 100. Read FIFO 212 and write FIFOs 214A-214B, which collectively form part of input-output elements 110, are also located in the peripheral region of IC 100. In this instance, the clock paths of PHY-CLK[7:0] clock tree 202 is shorter compared to the clock paths of CORE-CLK clock tree 204 that routes clock signals from PLL 125 to the respective logic blocks 217A-217C in core region 115 of IC 100.

In one embodiment, clock alignment circuitry 210 may be included in IC 100 to align clock signals generated by PLL 125 before they are transmitted to different parts of IC 100 through various clock trees. As shown in FIG. 2, the PHY-CLK[7:0] signal generated by PLL 125, together with its feedback signal PHY-FB-CLK may be routed to clock alignment circuitry 210. It should be appreciated that the PHY-FB-CLK signal and the CORE-FB-CLK signal are loopback signals from the end of the respective PHY-CLK[7:0] clock tree 202 and CORE-CLK clock tree 204. Clock alignment circuitry 210 may then generate the CORE-CLK signal based at least in part on phase differences between the PHY-FB-CLK and the CORE-FB-CLK signals and may transmit the CORE-CLK signal through CORE-CLK clock tree 204 to core region 115 of IC 100. It should be appreciated that feedback clock signals (e.g., PHY-FB-CLK signal and CORE-FB-CLK signal) may be routed back to clock alignment circuitry 210 as input clock signals that may be used to generate the adjusted output clock signal, CORE-CLK (the details of which will be explained in subsequent paragraphs). In the embodiment of FIG. 2, the CORE-CLK signal received at logic blocks 217A-217C in core region 115 may be aligned with the PHY-CLK[7:0] signal received at input-output elements 110 (or more specifically, at read FIFO 212 and write FIFOs 214A-214B) in the peripheral region of IC 100.

Figure 3:
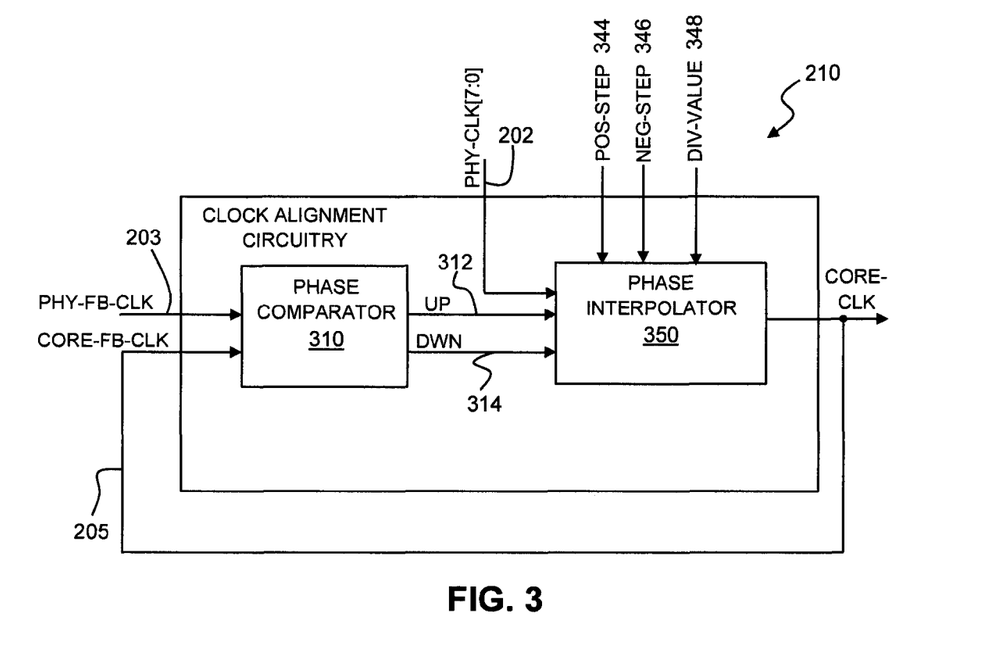
FIG. 3 shows illustrative clock alignment circuitry with a phase comparator and a phase interpolator in accordance with one embodiment of the present invention.

FIG. 3 shows illustrative clock alignment circuitry 210 with phase comparator 310 and phase interpolator 350 in accordance with one embodiment of the present invention. Phase comparator 310 may receive the PHY-FB-CLK signal through PHY-FB-CLK clock tree 203 (or the loopback end of PHY-CLK[7:0] clock tree 202) and the CORE-FB-CLK signal through CORE-FB-CLK clock tree 205 (or the loopback end of CORE-CLK clock tree 204). As shown in the embodiment of FIG. 2, PHY-FB-CLK clock tree 203 may be located at the periphery of IC 100 while CORE-FB-CLK clock tree 205 may be located in core region 115. As such, phases of the PHY-FB-CLK signal and the CORE-FB-CLK signal may be misaligned due to the different clock tree path lengths (as an example).

Phase comparator 310 may compare the two clock feedback signals, namely PHY-FB-CLK and CORE-FB-CLK, and generate two corresponding control signals (e.g., UP signal 312 and DWN signal 314) and the PHY-CLK[7:0] signal 202. The control signals are transmitted to phase interpolator 350 so that an output clock signal (e.g., the CORE-CLK signal) may be generated based on the control signals (e.g., UP 312 and DWN 314). In one embodiment, phase interpolator 350 may receive the PHY-CLK[7:0] signal from PHY-CLK[7:0] clock tree 202 at the peripheral region of IC 100 (as shown in FIG. 2), and as such, the output clock signal (e.g., CORE-CLK) may be generated by interpolating between multiple phases of the PHY-CLK[7:0] signal based on the control signals received from phase comparator 310 (UP signal 312 and DWN signal 314).

In the embodiment of FIG. 3, phase interpolator 350 may further receive different signals such as POS-STEP value 344, NEG-STEP value 346, and DIV-VALUE 348. As an example, these signals may be noise filter values for a digital low pass filter that may be used to determine the bandwidth of the filter. It should be appreciated that in this instance, the respective step values (e.g., POS-STEP value 344 of NEG-STEP value 346) may be determined by the noise profile of that particular filter (for instance, a smaller step value indicates that only high frequency noise will be filtered). Accordingly, DIV-VALUE 348 may be determined based on the frequencies of the clock signals (e.g., PHY-FB-CLK, CORE-FB-CLK and PHY-CLK[7:0]) received at clock alignment circuitry 210. In one embodiment, the PHY-FB-CLK signal (and the CORE-FB-CLK signal) may have a lower frequency compared to the PHY-CLK[7:0] signal. Therefore, the adjusted (or aligned) clock signal may need to be divided based on DIV-VALUE 348 before it is transmitted by phase interpolator 350 as an output clock signal CORE-CLK. The output clock signal CORE-CLK may then be routed back to clock alignment circuitry 210 as the CORE-FB-CLK signal.

Figure 4A:
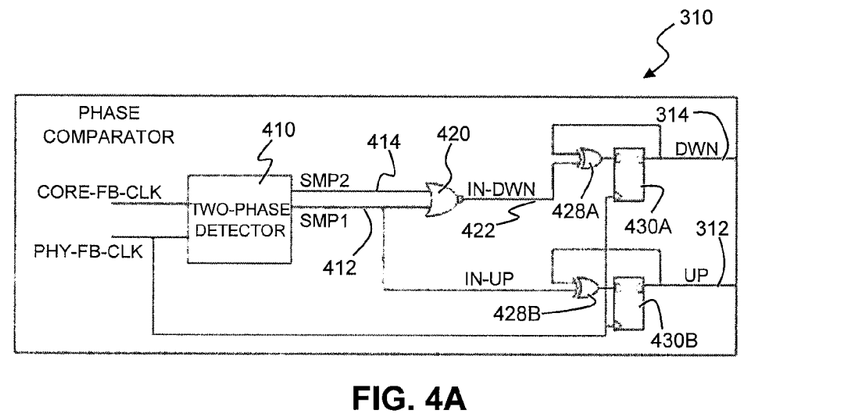
FIG. 4A shows a more detailed representation of an illustrative phase comparator in accordance with one embodiment of the present invention.

FIG. 4A shows a more detailed representation of illustrative phase comparator 310 in accordance with one embodiment of the present invention. Phase comparator 310 may include two-phase detector circuitry 410 and registers 430A and 430B. Two-phase detector circuitry 410 receives the CORE-FB-CLK signal from CORE-FB-CLK clock tree 205 and the PHY-FB-CLK signal from PHY-FB-CLK clock tree 203. In the embodiment of FIG. 4A, registers 430A and 430B may be clocked by the PHY-FB-CLK signal. Two different output signals (e.g., SMP1 signal 412 and SMP2 signal 414) may be generated by two-phase detector circuitry 410 based on the phases of the CORE-FB-CLK signal and the PHY-FB-CLK signal (the details of which will be explained below, in reference to FIGS. 4B and 4C).

Based on the output signals SMP1 412 and SMP2 414, registers 430A and 430B may generate the appropriate control signals (e.g., UP signal 312 and DWN signal 314) that will be used to control and adjust a phase interpolator circuit (e.g., phase interpolator 350 of FIG. 3). In the embodiment of FIG. 4A, a logic NOR circuit 420 receives output signals SMP1 412 and SMP2 414 from two-phase detector 410. Output 422 of logic NOR circuit 420 is then transmitted to the input of register 430A (or more specifically, to an input of logic XOR circuit 428A that is in turn, coupled to an input terminal of register 430A). Accordingly, output signal SMP1 412 from two-phase detector 410 is transmitted to register 430B through logic XOR circuit 428B.

In the embodiment of FIG. 4A, logic XOR circuits 428A and 428B may receive feedback output signals from registers 430A and 430B, respectively. In other words, logic XOR circuits 428A and 428B may receive output signals from registers 430A and 430B, respectively, from a previous clock cycle. Generally, a two-input logic XOR circuit (e.g., logic XOR circuit 428A or 428B) may generate a logic high signal when its inputs are at complementary (opposite) logic levels. As such, it should be appreciated that the control signals, namely UP signal 312 and DWN signal 314, may reflect the switching of the output signals SMP1 and SMP2 between different logic levels.

Figure 4B:
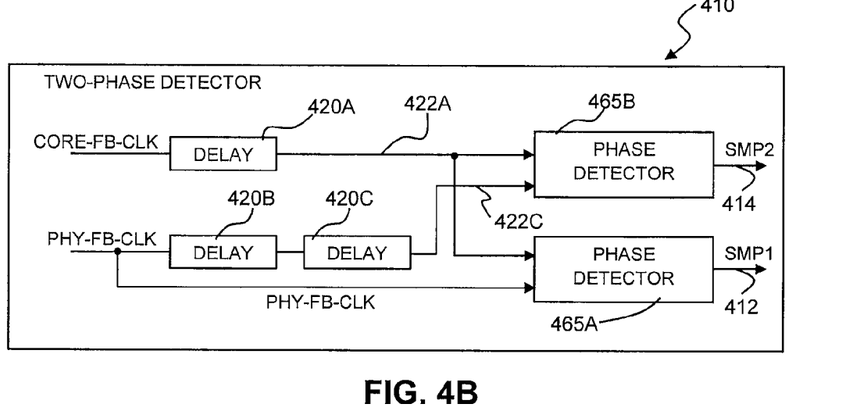
FIG. 4B shows a more detailed representation of two-phase detector circuitry in accordance with one embodiment of the present invention.

FIG. 4B depicts a more detailed representation of two-phase detector circuitry 410 in accordance with one embodiment of the present invention. Two-phase detector circuitry 410 may include two phase detector circuits, 465A and 465B, and multiple delay circuits 420A-420C. The CORE-FB-CLK and PHY-FB-CLK signals received at two-phase detector circuitry 410 may be transmitted, respectively, through delay circuits 420A and 420B-420C (to generate respective delayed versions of the two clock signals).

As shown in FIG. 4B, phase detector circuit 465A compares the delayed version of the CORE-FB-CLK signal 422A with the PHY-FB-CLK signal, whereas phase-detector circuit 465B compares the delayed version of the PHY-FB-CLK signal 422C with the delayed version of the CORE-FB-CLK signal 422A. Delay circuits 420A-420C may be used to obtain different sampling windows for the respective clock signals, CORE-FB-CLK and PHY-FB-CLK. Even though three delay circuits 420A-420C are shown in FIG. 4B, it should be appreciated that depending on the total delay required, fewer or more delay circuits may be used in this context. In one embodiment, each of the delay circuits 420A-420C may have a similar delay chain that provides an equal amount of delay to the respective clock signals. Accordingly, delay circuits 420B and 420C, combined, may provide a longer delay to the PHY-FB-CLK signal compared to delay circuit 420A.

It should be appreciated that delay circuits 420B and 420C may be used to create a "comparison window" within a single clock cycle of the CORE-FB-CLK signal. For example, phase detector circuit 465A may compare the PHY-FB-CLK signal with the delayed version of the CORE-FB-CLK signal 422A. In this instance, the phase of the PHY-FB-CLK signal is ahead of delayed CORE-FB-CLK signal 422A. Accordingly, phase detector circuit 465B compares delayed CORE-FB-CLK signal 422A with delayed PHY-FB-CLK signal 422C. In this case, as the total delay provided by delay circuits 420B and 420C is longer than that of delay circuit 420A, the phase of delayed PHY-FB-CLK signal 422C is behind delayed CORE-FB-CLK signal 422A. Phase detectors 465A and 465B may then generate output signals SMP1 412 and SMP2 414, respectively, based on phases of the two clock signals (e.g., PHY-FB-CLK and CORE-FB-CLK).

Figure 4C:
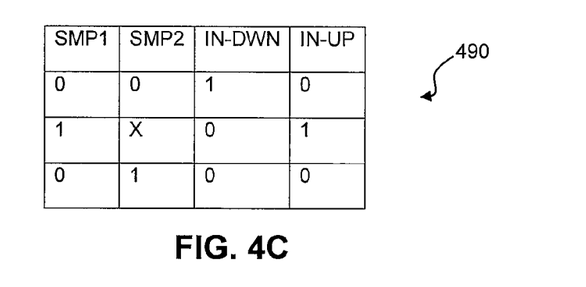
FIG. 4C is an illustrative truth table that shows different output values for different signals in accordance with one embodiment of the present invention.

FIG. 4C is an illustrative truth table 490 that shows the different output values of output signals SMP1 and SMP2 and the corresponding input values IN-DWN and IN-UP in accordance with one embodiment of the present invention. It should be appreciated that SMP1 and SMP2 represent the output signals from phase detector circuits 465A and 465B (as shown in FIG. 4B), respectively, while IN-DWN and IN-UP represent signals 422 and 412 in FIG. 4A (e.g., the input signals to the respective XOR logic circuits 428A and 428B).

In one embodiment, based on two-phase detector circuitry 410 shown in FIG. 4B, when both output signals SMP1 and SMP2 are at a logic low level (e.g., logic 0), the phase of the PHY-FB-CLK signal may be ahead of the phase of the CORE-FB-CLK signal. The IN-DWN signal may thus be set to a logic high level (e.g., logic 1). As shown in the embodiment of FIG. 4A, the IN-DWN signal may be generated by a two-input NOR logic circuit 420 that accepts output signals SMP1 and SMP2 as its inputs. As such, when both output signals SMP1 and SMP2 are at a logic low level, NOR logic circuit 420 may output a logic high level (e.g., logic 1) as IN-DWN signal 422.

When both the output signals SMP1 and SMP2 are at a logic high level, the phase of the PHY-FB-CLK signal may be behind the phase of the CORE-FB-CLK signal. As such, the IN-UP signal may be set to a logic high level. It should be appreciated that the IN-UP signal, as shown in FIG. 4A, may be directly coupled to output signal SMP1 412. Accordingly, in one embodiment, the logic level of the IN-UP signal directly corresponds to the logic level of output signal SMP1. As the IN-DWN signal is generated by a NOR logic circuit (e.g., NOR logic circuit 420 shown in FIG. 4A), as long as either one of its input signal, output signals SMP1 and SMP2) is at a logic high level, the output of the NOR logic circuit, IN-DWN signal, will be at a logic low level. Therefore, in truth table 490, SMP2 may be shown as a "don't care" value, X, when output signal SMP1 is at a logic high level.

When the CORE-FB-CLK signal is aligned with the PHY-FB-CLK signal, the output signal SMP1 may be at a logic low level and the output signal SMP2 may be at a logic high level. Accordingly, both the IN-UP and IN-DWN signals will be at a logic low level (based on phase comparator circuitry 310 of FIG. 4A). In one embodiment, the PHY-FB-CLK signal may be a reference clock signal. Therefore, when the PHY-FB-CLK signal is ahead of the CORE-FB-CLK signal, the IN-DWN signal is asserted (e.g., set to a logic high level) to adjust the CORE-FB-CLK signal to an earlier phase. Conversely, when the PHY-FB-CLK signal is behind the CORE-FB-CLK signal, the IN-UP signal is asserted to adjust the CORE-FB-CLK signal to a later phase.

Figure 5:
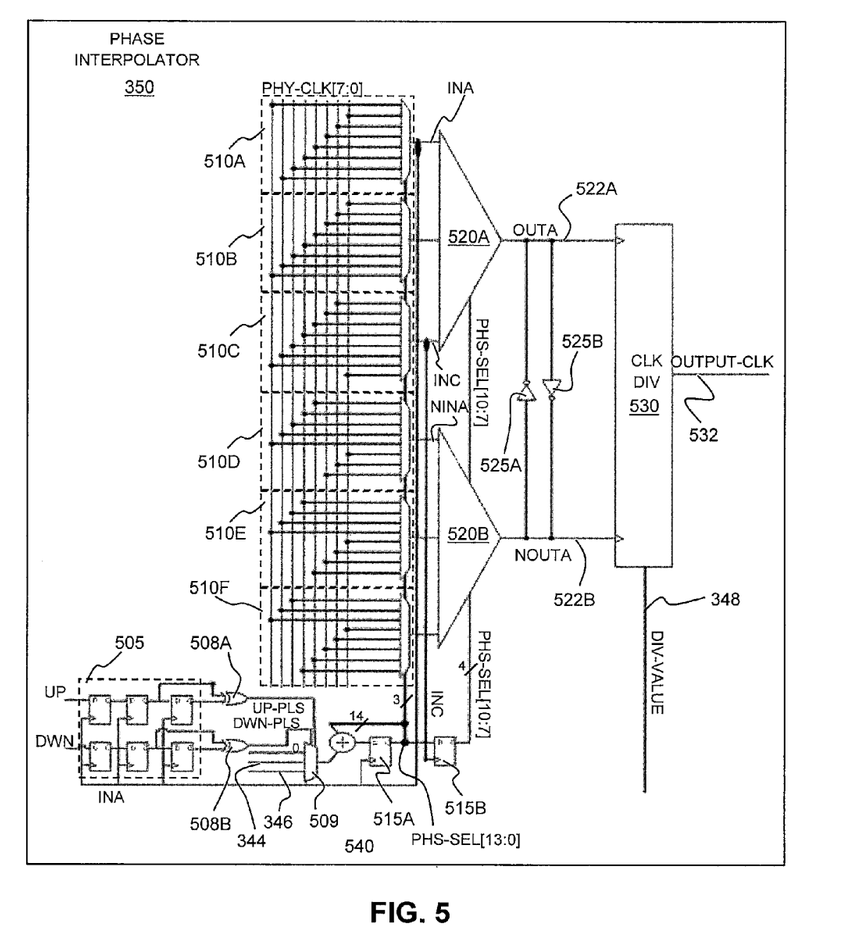
FIG. 5 depicts a more detailed representation of a phase interpolator in accordance with one embodiment of the present invention.

As explained above, phase comparator circuitry 310 of FIG. 4A may then generate the corresponding UP and DWN control signals based on the IN-UP and IN-DWN signals. The two control signals (UP and DWN) may then be used to control and adjust a phase interpolator such as phase interpolator 350 as shown in FIG. 3. It should be appreciated that any phase interpolator may be adjusted using the two control signals (UP and DWN) generated by phase comparator circuitry 310 of FIG. 4A. One specific configuration of such a phase interpolator is shown in FIG. 5.

Phase interpolator 350 may include, among others, numerous multiplexing circuits 510A-510F, two phase interpolator circuits 520A and 520B, and clock divider circuit 530. As shown in FIG. 3, phase interpolator 350 may receive UP and DWN control signals from phase comparator circuitry 310. In the embodiment of FIG. 5, multiple registers 505 (each clocked by a selected phase of the PHY-CLK[7:0] signal) may be used to receive the two UP and DWN control signals. XOR logic circuits 508A and 508B may generate UP-PLS and DWN-PLS signals, respectively, based on the UP and DWN control signals. In one embodiment, the PHY-CLK[7:0] signal may have a higher frequency compared to the PHY-FB-CLK signal. Therefore, as phase comparator circuitry 310 (shown in FIGS. 3 and 4A) is clocked by the PHY-FB-CLK signal, and phase interpolator 350 is clocked by the PHY-CLK[7:0] signal, registers 505 may be needed to generate UP-PLS and DWN-PLS signals that correlate with the frequency of the PHY-CLK[7:0] signal.

In one embodiment, UP-PLS and DWN-PLS signals may be used as select bits that control multiplexing circuit 509. As such, in the example of FIG. 5, depending on the UP-PLS and DWN-PLS signals, multiplexing circuit 509 may transmit either a constant value (e.g., 0), POS-FILTER 344, or NEG-FILTER 346 as an output. Adder circuit 540 receives the selected step value from multiplexing circuit 509 and a phase select value, PHS-SEL[13:0] from a feedback output of register 515A. In one embodiment, adder circuit 540 is a 14-bit adder that is used to generate the phase select bits (e.g., PHS-SEL[13:11]) that are used to select appropriate phases of the PHY-CLK[7:0] signal. In one embodiment, different bits of the 14-bit output from adder circuit 540 may be used to control multiplexing circuits 510A-510F and phase interpolator circuits 520A and 520B. For instance, a total of three bits (e.g., bits 13:11) may be used to control multiplexing circuits 510A-510F and a total of four bits (e.g., bits 10:7) may be used to control interpolator circuits 520A and 520B.

It should be appreciated that each of the multiplexing circuits 510A-510F is an 8-to-1 multiplexing circuit (i.e., a multiplexing circuit with 8 input terminals and an output terminal). Therefore, 3 select bits are required to control each of the multiplexing circuits 510A-510F. Each multiplexing circuit 510A-510F produces an output (INA-NINC) based on the select bits PHS-SEL[13:0]. In one embodiment, each of the multiplexing circuits 510A-510F may receive 8 different phases of the PHY-CLK[7:0] signal (which may be generated by a PLL circuit similar to PLL 125 of FIG. 1). Accordingly, depending on the select bits PHS-SEL[13:11], each of the multiplexing circuits 510A-510F may output an appropriate phase of the 8-phase PHY-CLK[7:0] signal.

As an example, the multiplexing circuits may be split into two groups (e.g., 510A-510C and 510D-510F) where one group of multiplexing circuits produces a set of clock signals with complementary phases to the clock signals produced by the other group of multiplexing circuits. Accordingly, the input terminals of the multiplexing circuits 510A-510F may be coupled such that every multiplexing circuit in a particular group will output a next adjacent phase of the 8-phase PHY-CLK[7:0] signal based on the output of the previous multiplexing circuit of that group.

To illustrate, each phase of the PHY-CLK[7:0] signal in the embodiment of FIG. 5 may have a 45-degree phase step (e.g., 0°, 45°, 90°, 135°, 180°, 225°, 270°, and) 315°. As such, when multiplexing circuit 510A outputs the 0° phase of the PHY-CLK[7:0] signal as output INA, multiplexing circuit 510B will output the 45° phase of the PHY-CLK[7:0] signal as output INB (not shown in FIG. 5), and multiplexing 510C will output the next adjacent phase, namely, the 90° phase of the PHY-CLK[7:0] signal as output INC. Accordingly, the second group of multiplexing circuits, 510D, 510E and 510F, may output the respective complementary phases of the outputs of multiplexing circuits 510A-510C (e.g., 180°, 225°, and 270°) as respective outputs NINA, NINB and NINC. Therefore, in one embodiment, each of the phase interpolator circuits 520A and 520B may select three adjacent clock phases to generate its corresponding interpolated clock output (e.g., OUTA 522A and NOUTA 522B). In one embodiment, interpolating with three (or more) clock phases may provide an interpolated clock output with more uniformed phases compared to using two clock phases.

As shown in FIG. 5, PHS-SEL[10:7], generated by register 515B (it should be appreciated that register 515B is a simplified block diagram of a 4-bit register), may be used to control phase interpolating circuits 520A and 520B. However, that depending on their resolution, fewer or more select bits may be used to control phase interpolating circuits 520A and 520B. The interpolated clock outputs OUTA 522A and NOUT 522B are transmitted to clock divider circuit 530. A pair of cross-coupled inverters 528A and 528B may be coupled between the two interpolated clock outputs OUTA 522A and NOUT 522B for improved duty cycle. Finally, clock divider circuit 530 may generate an output clock signal, OUTPUT-CLK 532, based on the interpolated clocks OUTA 522A and NOUT 522B.

In one embodiment, clock divider circuit 530 may be needed as the PHY-CLK[7:0] signal may have a higher frequency compared to the PHY-FB-CLK signal and the CORE-FB-CLK signal. Therefore, depending on the actual frequencies of the different clock signals, clock divider circuit 530 may divide interpolated clocks OUTA 522A and NOUT 522B based on a provided division value (e.g., DIV-VALUE 348). OUTPUT-CLK 532 may be transmitted as an output, CORE-CLK, of clock alignment circuitry 210 to CORE-CLK clock tree 204 (as shown in FIG. 3). The actual operation of clock alignment circuitry 210 of FIG. 3 with phase interpolator 350 may be explained further through exemplary output waveform 600 of FIG. 6.

Figure 6:
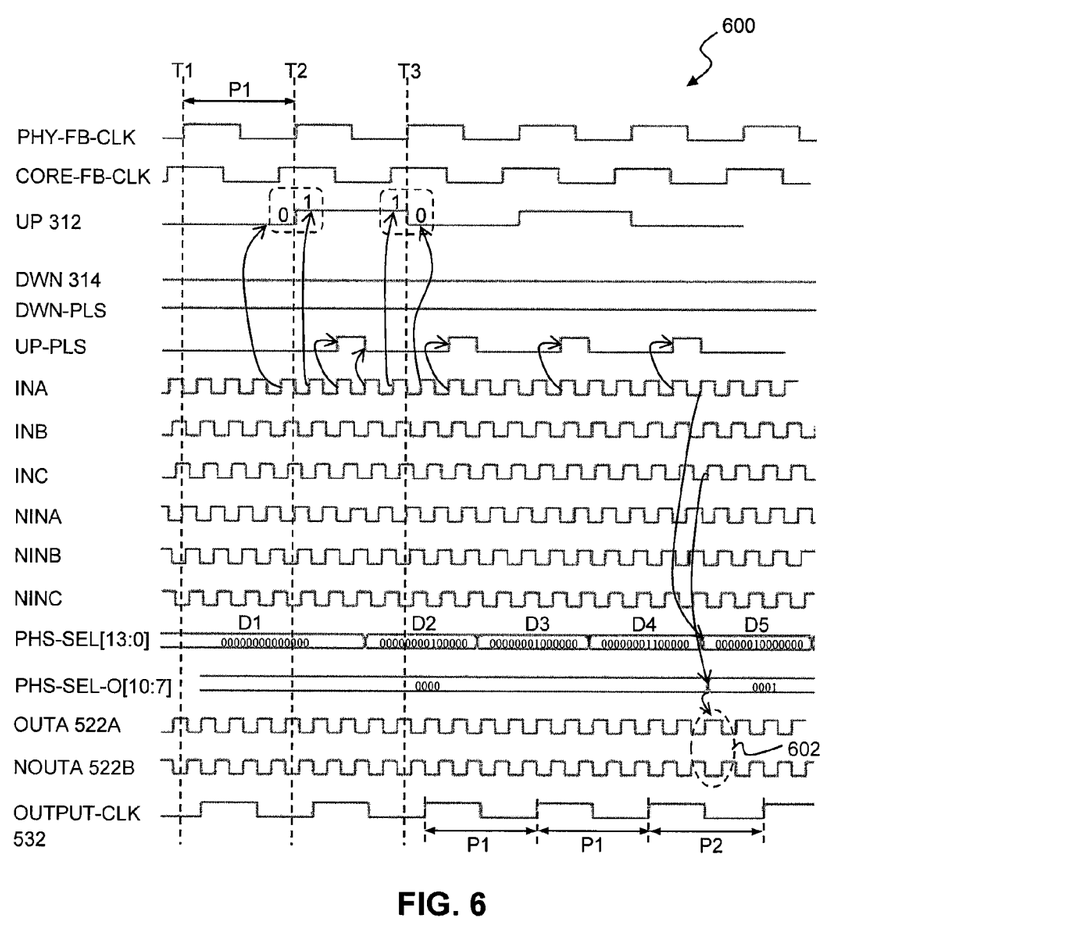
FIG. 6 depicts illustrative output waveforms of signals for clock alignment circuitry in accordance with one embodiment of the present invention.

FIG. 6 depicts illustrative output waveforms of the relevant input and output signals of clock alignment circuitry 210 of FIG. 2 and phase interpolator 350 of FIG. 5 in accordance with one embodiment of the present invention. As shown in FIG. 6, and explained above, the PHY-FB-CLK signal and the CORE-FB-CLK signal may have a lower frequency compared to the PHY-CLK[7:0] signal (the different phases of which are shown as outputs INA, INB, INC, NINA, NINB, and INIC in FIG. 6). As an example, the PHY-CLK[7:0] signal may be four times faster than the PHY-FB-CLK and CORE-FB-CLK signals. That is, as shown in FIG. 6, the period of one clock cycle P1 of the PHY-FB-CLK and CORE-FB-CLK signals is equivalent to four clock cycles of the PHY-CLK[7:0] signal.

In the embodiment of FIG. 6, the phase of the PHY-FB-CLK signal is behind the phase of the CORE-FB-CLK signal. In other words, if the PHY-FB-CLK signal is a reference clock signal, then the CORE-FB-CLK signal is considered to be ahead of its reference clock signal in this instance. As such, in order to align the CORE-FB-CLK signal with the PHY-FB-CLK signal, the phase of the CORE-FB-CLK signal may need to be adjusted to a later phase. Accordingly, in this instance, phase comparator circuitry 310 of FIG. 4A may assert UP control signal 312. In one embodiment, control signals (e.g., UP and DWN control signals) are set to a logic high level when they are asserted.

At the first rising edge of the PHY-FB-CLK signal at time T1, comparator circuitry 310 may determine that the PHY-FB-CLK signal is behind the CORE-FB-CLK signal (e.g., two-phase detector circuit 410 of FIGS. 4A and 4B may set output signals SMP1 and SMP2 to a logic high level). Accordingly, as registers 430A and 430B of FIG. 310 are clocked with the PHY-FB-CLK signal, at the next rising edge of the PHY-FB-CLK signal at time T2 (the next clock cycle), the UP control signal 312 is set to a logic high level. The UP control signal is asserted for one clock cycle and deasserted (e.g., set to a logic low level) at the following clock cycle, at time T3. It should be appreciated that in the embodiment of FIG. 4A, the UP control signal 312 will toggle at every clock cycle of the PHY-FB-CLK signal due to the XOR logic circuit 428B that is coupled to the feedback of the output of register 430B. As shown in the example of FIG. 6, DWN control signal 314 may not be asserted when the phase of the PHY-FB-CLK signal is behind the phase of the CORE-FB-CLK signal.

Accordingly, as DWN control signal 314 is not asserted, XOR logic circuit 508B in phase interpolator 350 of FIG. 5, may not assert the DWN-PLS signal. Based on the asserted pulses of UP control signal 312, the UP-PLS signal may be asserted by XOR logic circuit 508A. It should be appreciated that XOR logic circuits 508A and 508B may be used to detect when the respective UP and DWN control signals switch between different logic levels. Referring to FIG. 6, the UP-PLS signal is at a logic low level and is not asserted until slightly after time T2. As registers 505 in phase interpolator 350 of FIG. 5 are clocked by clock signal INA, at the rising edge of the clock signal INA slightly before time T2, UP control signal 312 is at a logic low level. At the rising edge of the next clock cycle of clock signal INA, slightly after time T2, UP control signal 312 switches to a logic high level. Therefore, at the rising edge of the following clock cycle (of clock signal INA), the UP-PLS signal is asserted, or set to a logic high level.

As UP control signal 312 stays at the logic high level at this point, the UP-PLS signal is deasserted at the next rising edge of clock signal INA. Subsequently, when UP control signal 312 switches from the logic high level to a logic low level at time T3, the UP-PLS signal may be reasserted at the following rising edge of the INA clock signal. Therefore, it should be appreciated that the UP-PLS signal may be asserted for one clock cycle of clock signal INA whenever its corresponding UP control signal 312 switches from one logic level to another. It should also be appreciated that even though DWN control signal 314 is not asserted in this example, the DWN-PLS signal may be similarly asserted when DWN control signal 314 is asserted (e.g., when the phase of the PHY-FB-CLK signal is ahead of the phase of the CORE-FB-CLK signal).

As shown in the embodiment of FIG. 5, the clock output signals INA, INB, INC, NINA, NINB and NINC may be selected based on phase select bits PHS-SEL[13:0]. As an example, the top three bits of the phase select bits, PHS-SEL[13:11], may be used to select desired phases from the 8-phase PHY-CLK[7:0] signal. As shown in FIG. 6, at time T1, the phase select bits PHS-SEL[13:0] may be set to 00000000000000 (as shown in data window D1). As the top three bits, PHS-SEL[13:11], are 000, multiplexing circuits 510A-510F may transmit their respective first input signals as outputs INA-NINC.

Referring to FIG. 5, the UP-PLS and DWN-PLS signals may be used to control multiplexing circuit 509. For instance, when both the UP-PLS and DWN-PLS signals are at a logic low level (e.g., 00), multiplexing circuit 509 may transmit a constant value (e.g., 0) to adder circuit 540. Therefore, the output of adder circuit 540, PHS-SEL[13:0], does not change when both the UP-PLS and DWN-PLS signals are not asserted. When the UP-PLS signal is asserted (as shown in FIG. 6), multiplexing circuit 509 may transmit a positive step value (in this example, the step value may be set to 0100000)

to adder circuit 540. Therefore, as shown in FIG. 6, when the UP-PLS signal is asserted, the value of PHS-SEL[13:0] may be updated.

For instance, after the first logic high pulse of the UP-PLS signal, the value of PHS-SEL[13:0] is updated to 00000000100000 (i.e., 00000000000000+0100000) at the next rising edge of clock signal INA (as shown in data window D2). At every subsequent clock cycle when the UP-PLS signal is asserted, the positive step value, 0100000, is added to PHS-SEL[13:0]. The subsequent output values of PHS-SEL[13:0] in FIG. 6 show PHS-SEL[13:0] with the accumulated step values: 00000001000000 in data window D3, 00000001100000 in data window D4 and 00000010000000 in data window D5. Even though not shown in the embodiment of FIG. 6, it should be appreciated that if the DWN-PLS signal is asserted instead of the UP-PLS signal, a negative step value (e.g., –0100000) may be added to PHS-SEL[13:0].

Referring to FIG. 5, phase interpolator circuits 520A and 520B may also be adjusted according to the phase select bits. In one embodiment, four selected bits from the phase select bits, PHS-SEL-O[10:7], may be used to control phase interpolator circuits 520A and 520B. As such, the output of register 515B, PHS-SEL-O[10:7] (as shown in FIG. 6), corresponds to the eighth, ninth, tenth and eleventh bits of PHS-SEL[13:0]. For instance, the output of register 515B, PHS-SEL-o[10:7] from time T1 may be 0000 when the corresponding four bits of PHS-SEL[13:0] remain unchanged. As described above, a step value may be added to PHS-SEL[13:0] whenever the UP-PLS signal is asserted.

Accordingly, as the eighth bit of PHS-SEL[13:0] (or any of the subsequent three bits) is changed as a result of the accumulated step values, for instance, from 00000001100000 at data window D4 to 00000010000000 at data window D5, PHS-SEL-O[10:7] may be updated accordingly. In the embodiment of FIG. 5, register 515B may be clocked by clock signal INC, and as such, as shown in FIG. 6, the value of PHS-SEL-O[10:7] may not updated concurrently with the value of PHS-SEL[13:0] as register 515A, which outputs PHS-SEL[13:0], may be clocked by a different clock signal, INA. In the embodiment of FIG. 6, PHS-SEL[13:0] may be updated at a rising edge of clock signal INA, and PHS-SEL-O[10:7] may be updated at a corresponding rising edge of clock signal INC. It should be appreciated that register 515B may be clocked with a different clock signal (preferably one with a later clock phase, e.g., INC) to accommodate any unwanted glitches when the output of register 515A, PHS-SEL[13:0] (clocked by clock signal INA), is updated.

The respective outputs, OUTA and NOUTA, of phase interpolator circuits 520A and 520B of FIG. 5 may be adjusted based on PHS-SEL-O[10:7]. The highlighted edges 602 of interpolated clock output signals OUTA 522A and NOUTA 522B in FIG. 6 show clock signals OUTA 522A and NOUTA 522B being interpolated based on the updated select bits, PHS-SEL-O[10:7]. As described earlier, the CORE-FB-CLK signal may be ahead of the PHY-FB-CLK signal and as such, the CORE-CLK signal (and subsequently the CORE-FB-CLK signal) may need to be adjusted to a later phase. Accordingly, the output clock signal, OUTPUT-CLK 532, from clock divider circuit 530 may be adjusted based on the two interpolated clock output signals OUTA 522A and NOUTA 522B. In the embodiment of FIG. 6, as OUTPUT-CLK 532 is shifted to a later phase, the clock period P2 of the affected clock cycle (e.g., the clock cycle when the OUTPUT-CLK 532 is adjusted) may be longer than the period P1 of the previous clock cycles (and its subsequent clock cycles) of OUTPUT-CLK 532.

Figure 7:
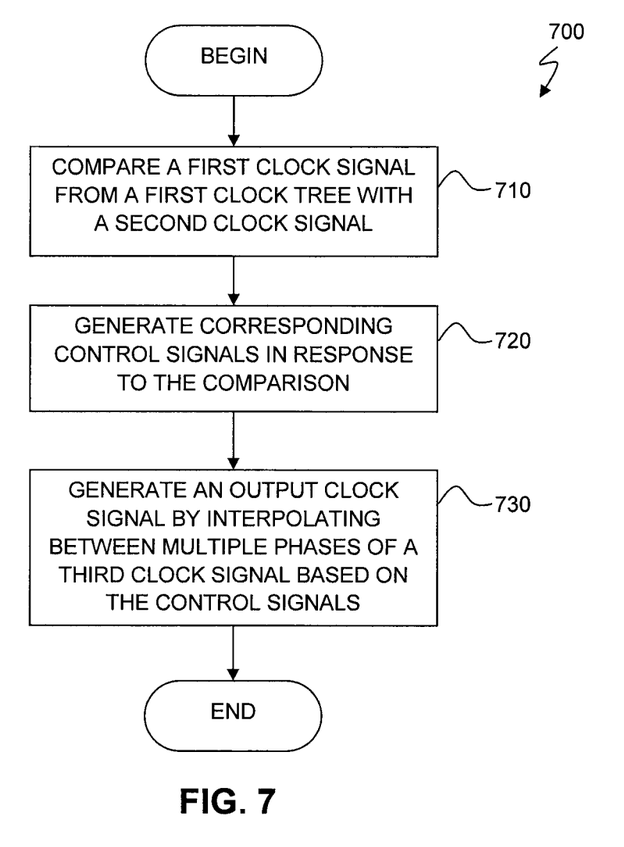
FIG. 7 is a flowchart of illustrative steps for aligning clock signals in an integrated circuit in accordance with one embodiment of the present invention.

FIG. 7 shows a flowchart of a method 700 for aligning clock signals in an integrated circuit in accordance with one embodiment of the present invention. At step 710, a first clock signal that is received from a first clock tree is compared with a second clock signal. In the embodiment of FIG. 3, phase comparator circuitry 310 receives the PHY-FB-CLK signal from the PHY-FB-CLK clock tree 203 and the CORE-FB-CLK signal from the CORE-FB-CLK clock tree 205. At step 720, corresponding control signals may be generated based on the comparison made at step 710. As an example, a phase comparator may be used to compare the two different clock signals to generate the corresponding control signals, such as UP 312 and DWN 314 control signals shown in FIG. 3.

At step 730, an output clock signal is generated by interpolating between multiple phases of a third clock signal based on the control signals generated at step 720. In the embodiment of FIG. 5, phase interpolator circuit 520A interpolates between three different phases of the PHY-CLK[7:0] signal to generate OUTPUT-CLK signal 532. Phase interpolator circuit 520A (and 520B) may be adjusted according to its control bits, PHS-SEL-O[10:7], which are generated based on the UP and DWN control signals received from a phase comparator circuit (e.g., phase comparator 350 of FIG. 3).

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. Clock alignment circuitry comprising:
   phase comparator circuitry having a first input terminal that receives a first clock signal from a first clock tree and a second input terminal that receives a second clock signal from a second clock tree, wherein the phase comparator circuitry compares the first and second clock signals and outputs corresponding first and second control signals; and
   phase interpolator circuitry that receives a third clock signal and that generates an output clock signal that is aligned with one of the first and second clock signals based on at least one of the first and second control signals, wherein the first clock signal comprises a loop-back version of the third clock signal being routed through the first clock tree.

2. The clock alignment circuitry defined in claim 1, wherein the phase comparator circuitry operates at a first frequency, wherein the phase interpolator circuitry operates at a second frequency, and wherein the phase comparator circuitry comprises:
   a two-phase detector circuit that receives the first and second clock signals, wherein the two-phase detector circuit produces first and second output signals based on phases of the first and second clock signals; and
   synchronization circuitry having first and second input terminals that receives the first and second output signals, respectively, wherein the synchronization circuitry asserts the first control signal when the first output signal switches from one logic level to another, and wherein the synchronization circuitry asserts the second control signal when the second output signal switches from one logic level to another.

3. The clock alignment circuitry defined in claim 2, wherein the synchronization circuitry comprises:
   a first logic circuit that receives the first and second output signals from the phase detector circuit;
   first and second storage elements each having a clock terminal that receives the second clock signal, wherein the first and second storage elements produce the first and second control signals, respectively;
   a second logic circuit having a first input terminal that receives an output from the first logic circuit and a second input terminal that receives the first control signal as a feedback input; and
   a third logic circuit having a first input terminal that receives the first output signal from the phase detector circuit and a second input terminal that receives the second control signal as a feedback input.

4. The clock alignment circuitry defined in claim 2, wherein the two-phase detector circuit comprises:
   a first phase detector that receives a delayed version of the first clock signal and the second clock signal, wherein the first phase detector produces the first output signal based on phases of the delayed version of the first clock signal and the second clock signal; and
   a second phase detector that receives the delayed version of the first clock signal and a delayed version of the second clock signal, wherein the second phase detector produces the second output signal based on phases of the delayed versions of the first and second clock signals.

5. The clock alignment circuitry defined in claim 4, wherein the two-phase detector circuit further comprises:
   a first delay chain that receives the first clock signal to produce the delayed version of the first clock signal; and
   a second delay chain that receives the second clock signal to produce the delayed version of the second clock signal, wherein the second delay chain has a longer delay than the first delay chain.

6. The clock alignment circuitry defined in claim 5, wherein the second clock signal comprises a first sampling window for the first phase detector circuit, wherein the delayed version of the second clock signal comprises a second sampling window for the second phase detector circuit, and wherein the second sampling window comes after the first sampling window.

7. The clock alignment circuitry defined in claim 1, wherein the phase interpolator circuitry comprises:
   an adder circuit that receives a plurality of bits as a step value based on at least one of the first and second control signals, wherein the adder circuit generates a plurality of select bits based on an accumulated step value; and
   a phase interpolator circuit that receives at least three different respective phases of the third clock signal, wherein the phase interpolator outputs an interpolated clock signal from the three different respective phases of the third clock signal based on the plurality of select bits.

8. The clock alignment circuitry defined in claim 7, wherein the phase interpolator circuitry further comprises:
   an additional phase interpolator circuit that receives at least an additional three different respective phases of the third clock signal, the additional phase interpolator having an output that generates an additional interpolated clock signal from the additional three different respective phases of the third clock signal based on the plurality of select bits; and
   clock divider circuitry that receives the interpolated clock signal and the additional interpolated clock signal, wherein the clock divider circuitry generates the adjusted output clock signal based on the interpolated and the additional interpolated clock signals.

9. The clock alignment circuitry defined in claim 8, wherein the third clock signal is an eight-phase clock signal, wherein the three respective phases of the third clock signal are three neighboring phases in the eight-phase clock signal, and wherein the additional three respective phases are opposite phases of the three respective phases.

10. Clock alignment circuitry comprising:
    phase comparator circuitry that receives first and second feedback clock signals from first and second clock trees, respectively, wherein the phase comparator circuitry generates first and second control signals based on phases of the first and second feedback clock signals; and
    phase interpolator circuitry that receives the first and second control signals and that adjusts a phase of an output feedback clock signal based on at least one of the first and second control signals such that the phase of the output feedback clock signal is aligned with a phase of the first feedback clock signal, wherein the phase interpolator circuitry comprises:

a first phase interpolator that receives first, second, and third phases of an input clock signal and that generates a corresponding first interpolated clock signal; and a second phase interpolator that receives fourth, fifth and sixth phases of the input clock signal and that generates a corresponding second interpolated clock signal, wherein the first, second, third, fourth, fifth, and sixth clock phases each have a different respective phase value, and wherein the first feedback clock signal comprises a feedback of the input clock signal.

11. The clock alignment circuitry defined in claim 10, further comprising:

a clock divider circuit that receives the first and second interpolated clock signals, wherein the clock divider circuit generates the output feedback clock signal based on the first and second interpolated clock signals.

12. The clock alignment circuitry defined in claim 10, further comprising:

a plurality of multiplexing circuits that receives a plurality of phases of the input clock signal, wherein first, second, and third multiplexing circuits in the plurality of multiplexing circuits selectively transmits the respective first, second and third phases of the input clock signal to the first phase interpolator, and wherein fourth, fifth and sixth multiplexing circuits in the plurality of multiplexing circuits selectively transmits the respective fourth, fifth and sixth phases of the input clock signal to the second phase interpolator.

13. The clock alignment circuitry defined in claim 10, wherein the first and second interpolators further receives a plurality of select bits, and wherein the first and second interpolated clock signals are generated based on the plurality of select bits.

14. The clock alignment circuitry defined in claim 13 further comprising:

an adder circuit that receives an input signal with a selected predefined value, wherein the adder circuit generates the plurality of select bits based on an accumulated selected predefined value.

15. The clock alignment circuitry defined in claim 14 further comprising:

a selector circuit that receives a plurality of input signals with respective predefined values, wherein the selector circuit further receives the first and second control signals from the phase comparator circuitry, wherein an output of the selector circuit transmits one of the input signals to the adder circuit as the input signal with the selected predefined value based on the first and second control signals from the phase comparator circuitry.

16. A method of aligning clock signals in an integrated circuit, the method comprising:

with phase comparator circuitry, comparing a first feedback clock signal received from a first clock tree with a second feedback clock signal received from a second clock tree;

in response to comparison of the first and second feedback clock signals, generating first and second control signals with the phase comparator circuitry; and with interpolator circuitry, interpolating from a plurality of phases of a third clock signal based on at least one of the first and second control signals to generate an output clock signal, wherein the third clock signal is routed through the first clock tree to produce the first feedback clock signal.

17. The method defined in claim 16 further comprising:

generating a plurality of select bits based on the first and second control signals; and with a selection circuit, selecting at least three neighboring phases of the third clock signal based on a first portion of the plurality of select bits, wherein the interpolation is performed among the three neighboring phases based on a second portion of the plurality of select bits.

18. The method defined in claim 17, wherein the first and second feedback clock signals have a first frequency and wherein the third clock signal has a second frequency, the method further comprising:

with a clock divider circuit, dividing the output clock signal to generate an aligned output clock signal, wherein the aligned output clock signal is an adjusted version of the first feedback clock signal with edges that align with edges of the second feedback clock signal.

19. The method defined in claim 16, wherein generating the first and second control signals in response to the comparison comprises:

with a first delay chain, delaying the first feedback clock signal to generate a delayed version of the first feedback clock signal;

with a second delay chain that is longer than the first delay chain, delaying the second feedback clock signal to generate a delayed version of the second feedback clock signal;

with a first phase detector circuit in the phase comparator circuitry, comparing the delayed version of the first feedback clock signal with the second feedback clock signal to generate a first output signal; and with a second phase detector circuit in the phase comparator circuitry, comparing the delayed versions of the first and second feedback clock signals to generate a second output signal, wherein the first and second control signals are generated based on the first and second output signals.

* * * * *